US006650588B2

(12) United States Patent
Yamagata (10) Patent No.: US 6,650,588 B2
(45) Date of Patent: Nov. 18, 2003

(54) SEMICONDUCTOR MEMORY MODULE AND REGISTER BUFFER DEVICE FOR USE IN THE SAME

(75) Inventor: Tadato Yamagata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/178,537

(22) Filed: Jun. 25, 2002

(65) Prior Publication Data

US 2003/0026155 A1 Feb. 6, 2003

(30) Foreign Application Priority Data

Aug. 1, 2001 (JP) ........................................ 2001-233821

(51) Int. Cl.[7] ................................................ G11C 7/00
(52) U.S. Cl. ........................ 365/222; 365/194; 365/233
(58) Field of Search ................................ 365/222, 194, 365/233, 233.5, 230.03, 189.07

(56) References Cited

U.S. PATENT DOCUMENTS 4,939,695 A * 7/1990 Isobe et al. .................. 365/222

6,515,922 B1 2/2003 Yamagata .................... 365/201

FOREIGN PATENT DOCUMENTS

| JP | 9-231129 | 9/1997 |
|---|---|---|
| JP | 11-134857 | 5/1999 |

OTHER PUBLICATIONS

"PC SDRAM Registered DIMM Design Support Document", pp. 1 and 31, Oct. 1998.
"SN4SSTV16857, 14–Bit Registered Buffer with SSTL2 Inputs and Outputs", Texas Instruments, Oct. 4, 1999, pp. 1–5.

* cited by examiner

*Primary Examiner*—David Lam
(74) *Attorney, Agent, or Firm*—McDermott, Will & Emery (57) ABSTRACT

In a semiconductor memory module having a plurality of DRAMs, when an input command is detected as a refresh command according to external control signals externally input for command-execution to a register buffer, internal control signals for a partial number of the DRAMs preliminarily selected among the plurality of DRAMs are delayed. Thus, the refresh command is executed with a time difference, and the semiconductor memory module prevents the plurality of dynamic semiconductor memories from simultaneously entering refresh modes to cause a great peak current to flow, and thereby implementing a stable operation.

13 Claims, 11 Drawing Sheets

| Inputs | | | | Outputs |
|---|---|---|---|---|
| /RESET | CK | /CK | Input | |
| H | ↑ | ↓ | L | L |
| H | ↑ | ↓ | H | H |
| H | L or H | L or H | X | Q0 |
| L | X or Floating | X or Floating | X or Floating | L |

Fig.13 PRIOR ART

SEMICONDUCTOR MEMORY MODULE AND REGISTER BUFFER DEVICE FOR USE IN THE SAME

BACKGROUND OF THE INVENTION

1. Field of the Invention

The present invention relates to a semiconductor memory module, and particularly relates to improvements in a refresh control technique for a storage device using a plurality of dynamic semiconductor memories.

2. Description of the Prior Art

Generally, a semiconductor memory module is formed of a semiconductor chip (RAM chip) mounted thereon that includes a plurality of dynamic RAMs (each of which hereinbelow will be referred to as a "DRAM"). More specifically, in a configuration of the semiconductor memory module, signals such as a chip-selecting signal and a refresh command signal are generated and supplied to the individual DRAMs. The chip-selecting signal indicates which one of the DRAMs is selected to operate according to a high-order bit of an address signal supplied from a microprocessor.

The refresh command signal provides refresh timing according to control signals supplied from a microprocessor. The control signals include a chip enable signal CE, a read enable signal RE, a row-address strobe signal RAS, and a column-address strobe signal CAS. Each of the DRAMs has a refresh control function of determining a refresh mode according to the row-address strobe signal RAS and the column-address strobe signal CAS, driving a word line to a selected level and performing a refresh operation.

Ordinarily, a memory cell array in a DRAM chip is divided into a plurality of memory banks, and is configured to drive only a selected part of the memory banks to perform a read/write operation. However, in a refresh operation, all the banks are operated, and the peak current therefore is increased. Thus, a high peak current flows into the DRAM module in the refresh operation, and a Vdd/GND noise (power-supply noise) occurs to cause a malfunction in the module.

Figure 10:
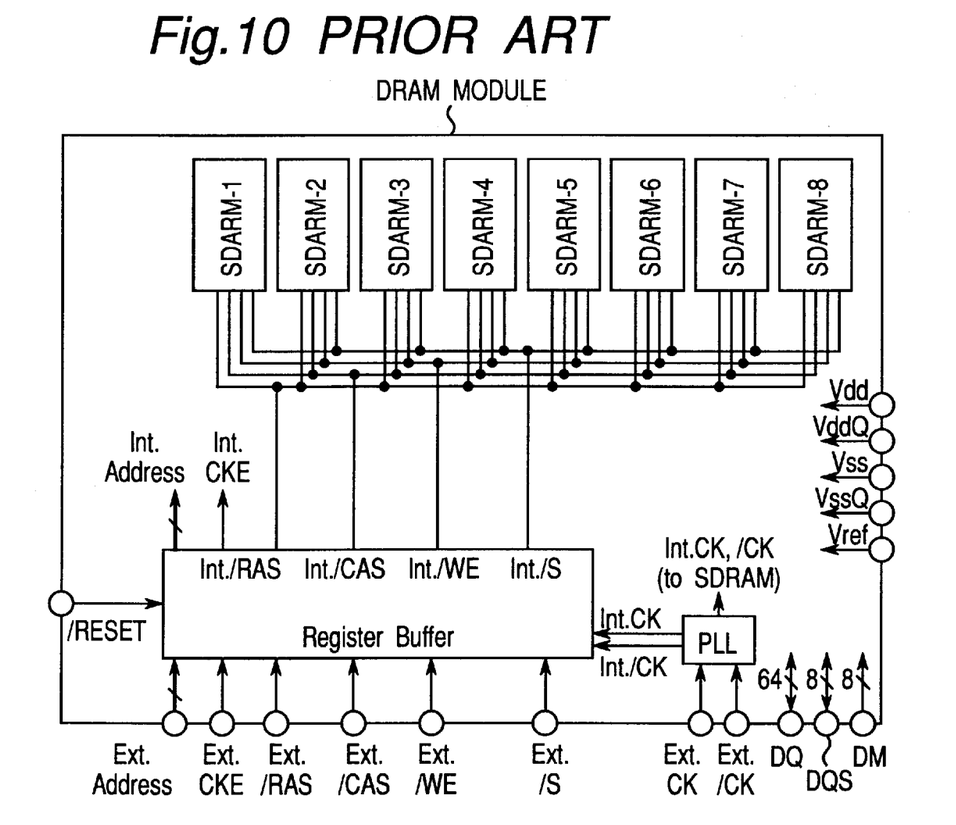
FIG. 10 is a block diagram showing a configuration of a conventional semiconductor memory module.

FIG. 10 shows a conventional example of an ordinary type of a registered DIMM provided with eight DDR SDRAMs to have a ×8-word-configuration. In the configuration shown in the figure, a register buffer and a PLL circuit for generating a base clock are mounted on the module which is formed of a one-bank configuration.

When an external control signal Ext./S, which is a chip-selecting signal, is input to the module, an internal control signal Int./S is output from the register buffer and is transferred to all the DRAMs. As a result, in response to a command defined by combination of external control signals Ext./RAS, Ext./CAS, and Ext./WE, all the chips SDRAM-1 to SDRAM-8 are simultaneously operated according to internal control signals Int./RAS, Int./CAS, and Int./WE.

Figure 11:
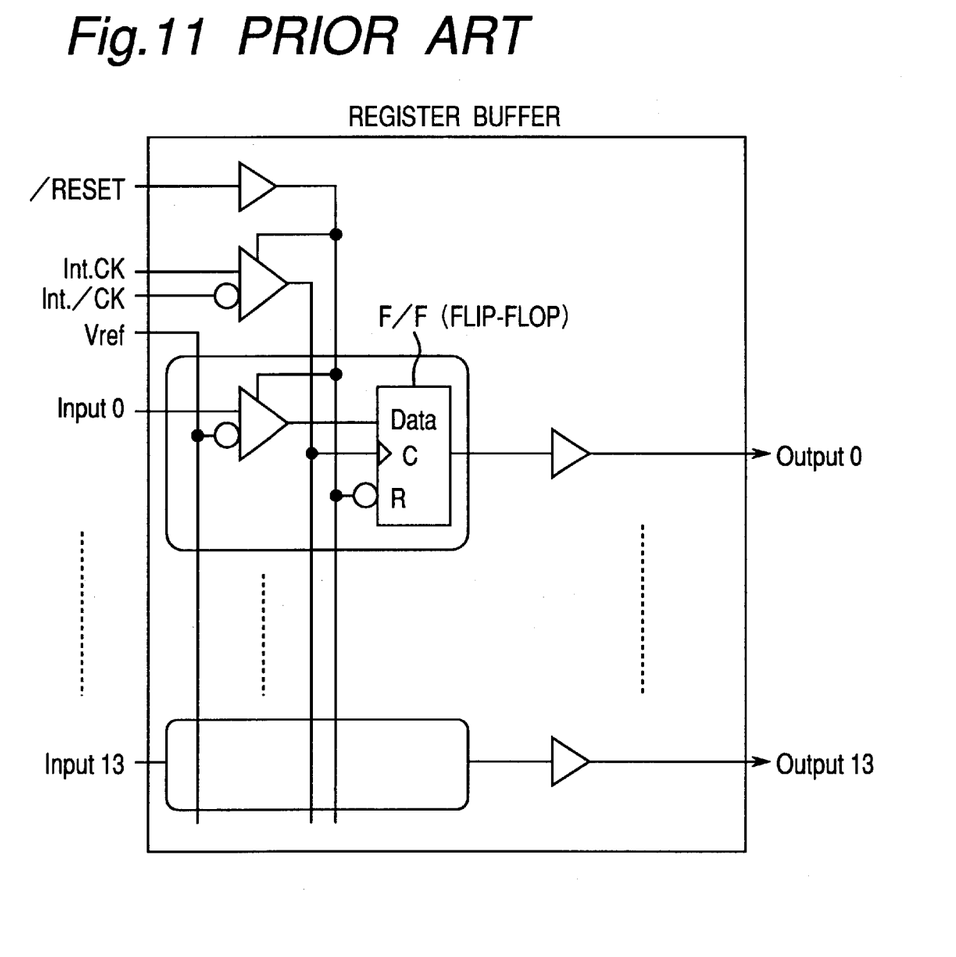
FIG. 11 is a circuit configuration view showing a configuration of a conventional register buffer.

The circuit configuration of the register buffer mounted on the above-described module is known in the art as shown in FIG. 11. In the configuration, according to various control signals /RESET, Int.CK, Int./CK, and Vref, input signals Input 0 to 13 are individually delayed via an inverter and a flip-flop circuit (F/F). Thereafter, output signals Output 0 to 13 are generated.

Figure 12:
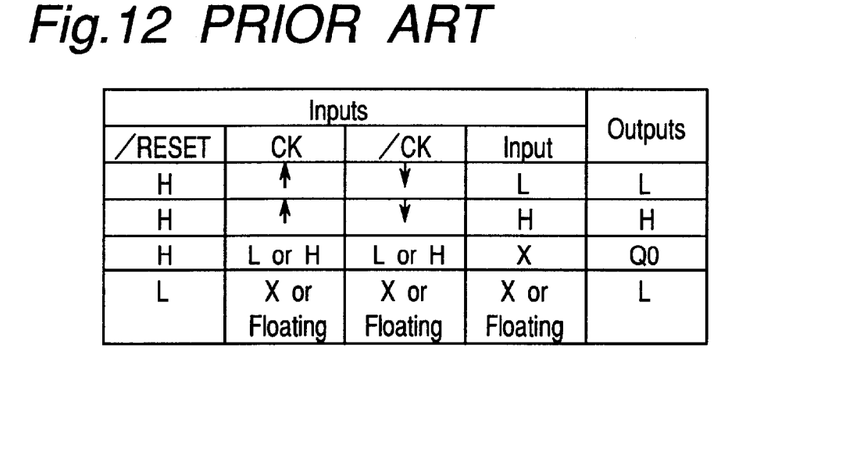
FIG. 12 is a function table of output signals responding to various input signals of the conventional register buffer.

FIG. 12 shows a function table of the output signals in response to H/L levels of the various input signals /RESET, CK, /CK, and Inputs.

Figure 13:
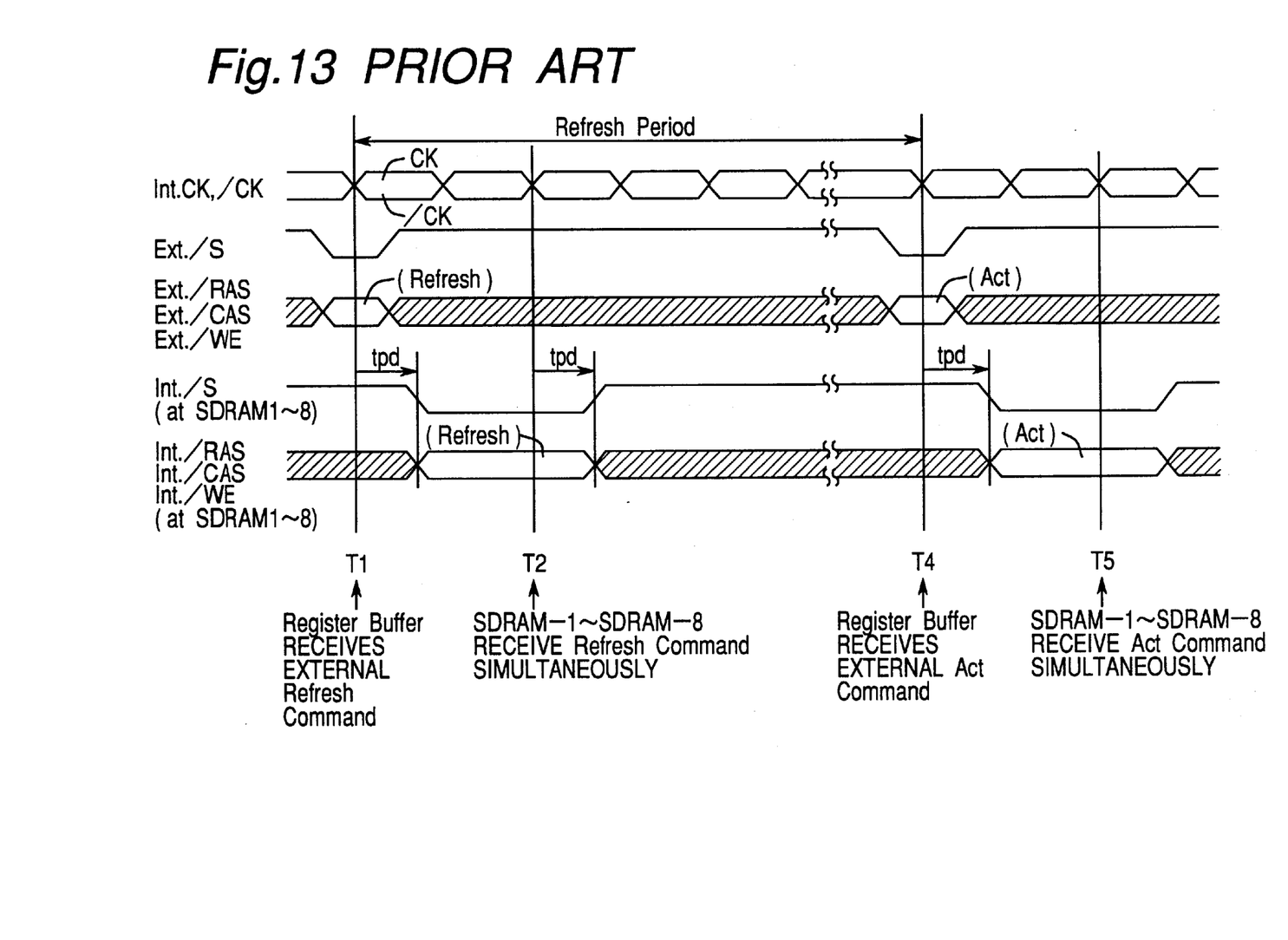
FIG. 13 is a timing diagram representing operations of the conventional semiconductor memory module.

FIG. 13 shows operational timings in the conventional configuration shown in FIG. 10. The operational timings represent timings of operation performed such that a refresh command (Refresh) of /RAS, /CAS, and /WE is input, and thereafter, an activation (Act) command is input. As shown in FIG. 13, at time T1, an external refresh command (Ext./RAS, Ext./CAS, and Ext./WE) is received by the register buffer, and at time T2 after one cycle operation from T1, an internal refresh command of Int./RAS, Int./CAS, and Int./WE is simultaneously received by each of the eight DRAMs.

In FIG. 13, a delay time tpd represents a necessary time set by totaling a delay time caused within the register buffer and a wiring delay time caused in the field from the register-buffer output to the SDRAM input. The Act command activates the bank in the DRAM chip. After the external Act command is input at time T4, an internal Act command is simultaneously received by the eight SDRAM-1 to SDRAM-8 at time T5. As shown in the figure, since all the eight DRAMs simultaneously start refresh operations, a great peak current flows to be a problem.

SUMMARY OF THE INVENTION

The present invention is made to solve the above-described problems. Accordingly, an object of the present invention is to provide a semiconductor memory module in which execution timings of a refresh command are differentiated and distributed to inhibit a great peak current from flowing when a plurality of DRAMs simultaneously enter refresh modes. Thus, generation of Vdd/GND noise is inhibited, and stable operation can thereby be implemented.

Another object of the present invention is to provide a novel register buffer used in a semiconductor memory module implementing the above features.

To achieve the above objects, the present invention provides a semiconductor memory module which is provided with a plurality of DRAMs, and when an input command is detected as a refresh command according to external control signals externally input to a register buffer for command-execution, internal control signals for a partial number of the DRAMs preliminarily selected among the plurality of DRAMs are delayed. Thus, the refresh command is executed with a time difference, and the semiconductor memory module prevents the plurality of dynamic semiconductor memories from simultaneously entering refresh modes to cause a great peak current to flow.

According to a first aspect of the present invention, a semiconductor memory module is provided with a plurality of dynamic semiconductor memories, and generates internal control signals as a command to be applied to the plurality of individual dynamic semiconductor memories according to external control signals externally input to thereby execute the command. The semiconductor memory module includes: mode determining means for determining whether or not the command is a refresh command in a refresh mode according to the internal control signals; and delay means for establishing a delay in applying the internal control signals to a partial number of dynamic semiconductor memories preliminarily selected among the plurality of dynamic semiconductor memories. Thus, the refresh command is transferred to the plurality of dynamic semiconductor memories with a time difference according to the delay in the refresh mode.

By this configuration, since the plurality of dynamic semiconductor memories that simultaneously perform refresh operations on the module can be distributed to the plurality of groups, the peak current can be significantly reduced.

According to a second aspect of the present invention, there is provided a register buffer device used in a semiconductor memory module having a plurality of dynamic semiconductor memories mounted thereon, and the register buffer device includes: means for generating internal control signals for executing a command for the plurality of individual dynamic semiconductor memories according to external control signals externally input to the register buffer device. The register buffer device further includes mode determining means for determining whether or not the command is a refresh command in a refresh mode according to the external control signals; and delay means for establishing a delay in the internal control signals to be supplied to a partial number of dynamic semiconductor memories preliminarily selected among the plurality of dynamic semiconductor memories. Thus, the refresh command is transferred to the plurality of dynamic semiconductor memories with a time difference according to the delay in the refresh mode.

According to a third aspect of the present invention, there is provided a register buffer device used in a semiconductor memory module having a plurality of dynamic semiconductor memories mounted thereon. The register buffer device includes control means for performing control operations of: generating internal control signals for executing a command for the plurality of individual dynamic semiconductor memories according to external control signals externally input to the register buffer device; determining whether or not the command is a refresh command in a refresh mode according to the external control signals; and establishing a delay in the internal control signals to be supplied to a partial number of dynamic semiconductor memories preliminarily selected among the plurality of dynamic semiconductor memories. Thus, the refresh command is transferred to the plurality of dynamic semiconductor memories with a time difference according to the delay in the refresh mode.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Hereinbelow, referring to FIGS. 1 to 9, embodiments of the present invention will be described. In the figures, the same reference numerals and symbols are used for common portions, and duplicated descriptions will be omitted.

(First Embodiment)

Figure 1:
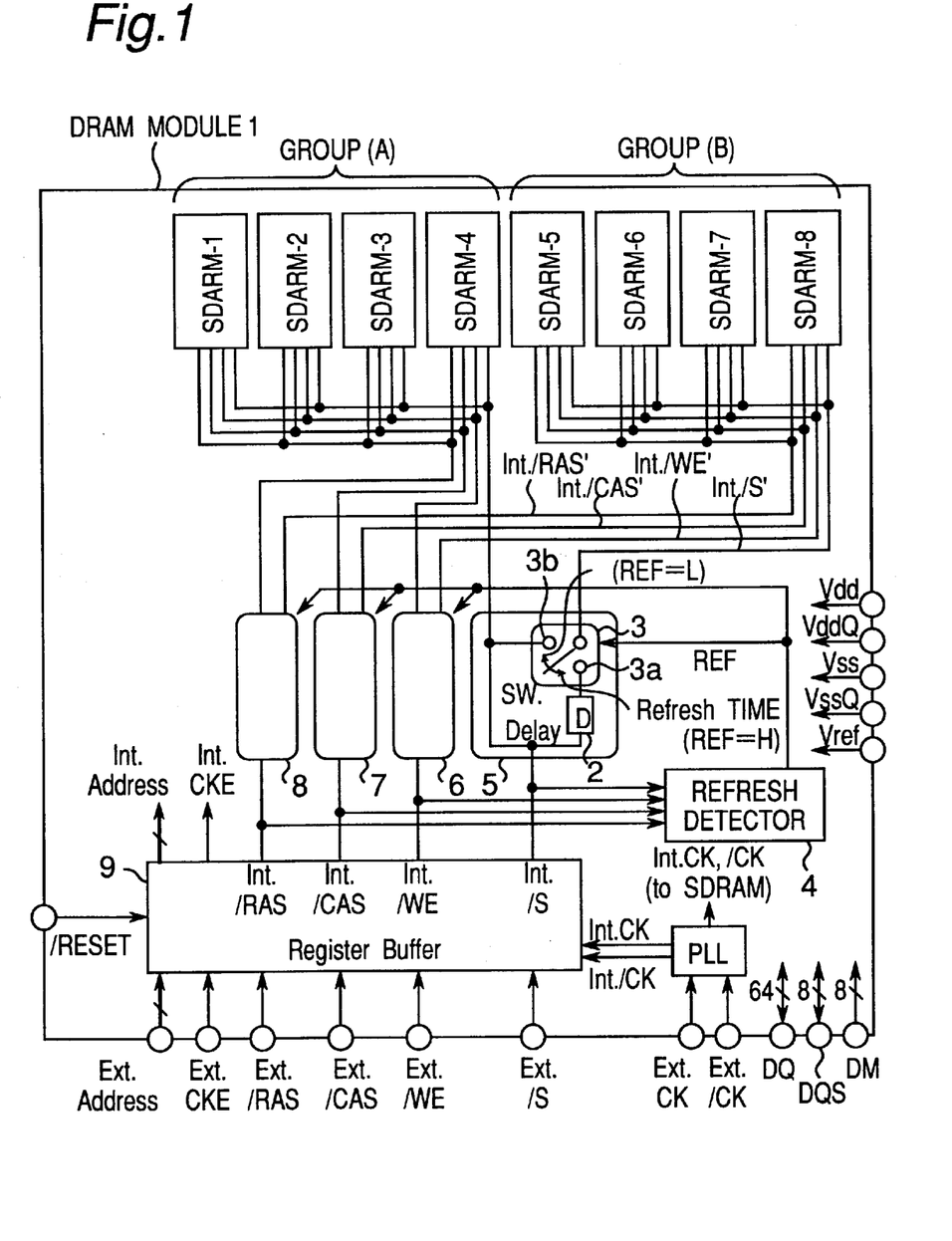
FIG. 1 is a block diagram showing a configuration of a semiconductor memory module according to a first embodiment of the present invention.
Figure 2:
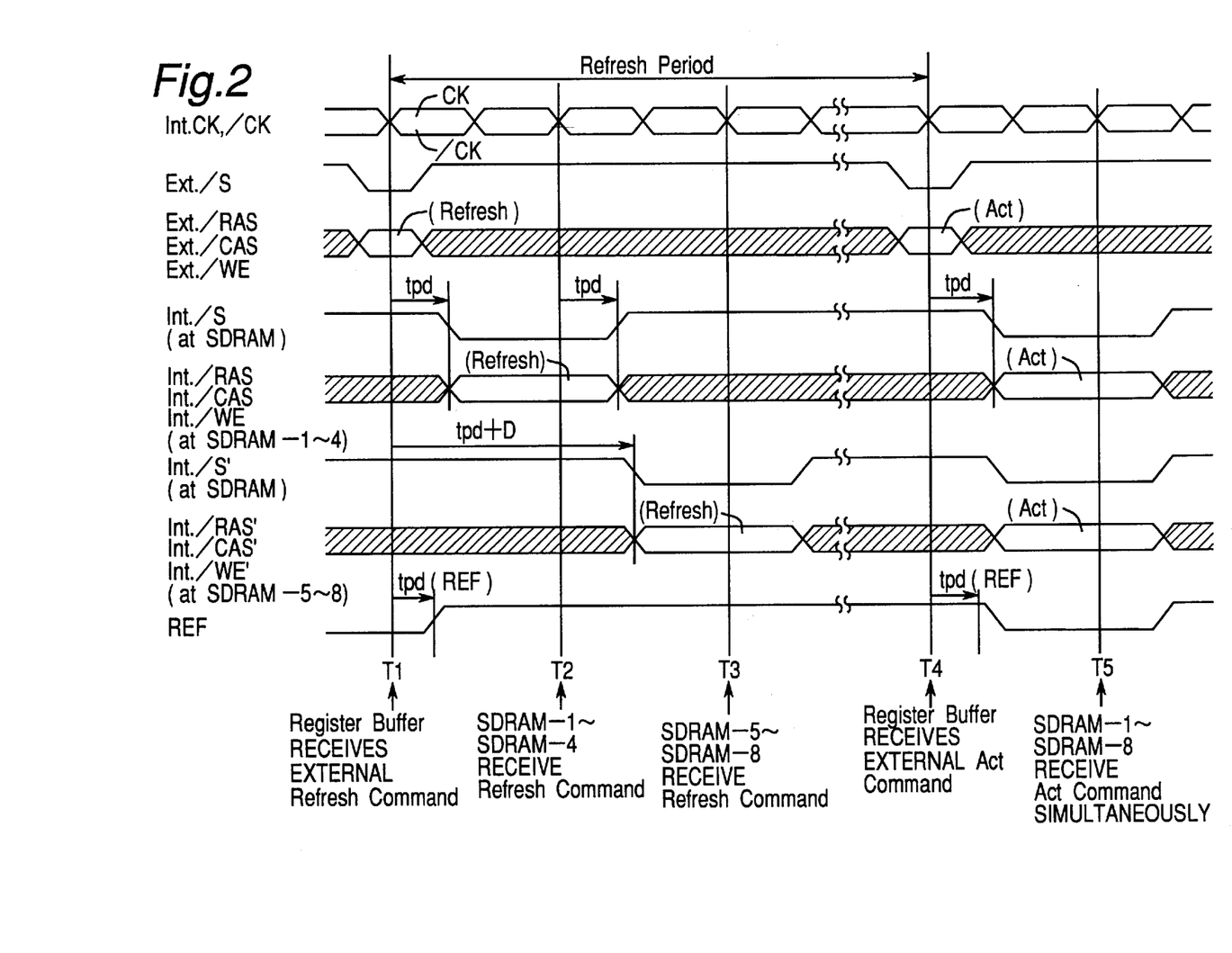
FIG. 2 is a timing diagram representing operations of the semiconductor memory module according to the first embodiment of the present invention.

Hereinbelow, a first embodiment of the present invention will be described with reference to FIGS. 1 to 4. FIG. 1 shows a circuit configuration of a DRAM module 1 according to a first embodiment, and FIG. 2 shows a timing diagram of the circuit. In the present embodiment, eight SDRAMs SDRAM-1 to SDRAM-8 mounted on a module 1 are separated into two groups, i.e., a first group A and a second group B, each group consisting of four pieces of the SDRAMs. Specifically, the first group A (first group SDRAMs-(A)) is comprised of SDRAM-1 to SDRAM-4 and the second group B (second group SDRAMs-(B)) is comprised of SDRAM-5 to SDRAM-8. In this configuration, refresh-operation timings in the groups A and B are differentiated from each other. Specifically, the timings are differentiated by providing a time difference corresponding to one cycle of a clock signal (CK or /CK).

In order to provide the time difference in the refresh-operation timing, delay circuits 2 (D), mode switches 3 (SW), and a refresh detection circuit 4 are additionally mounted on the module 1. Each of four circuit blocks 5 to 8 is formed of the delay circuit 2 and the mode switch 3 (SW) coupled together, and the four circuit blocks 5 to 8 are individually coupled between the output terminals of the internal control signals Int./S, Int./WE, Int./CAS, and Int./RAS of a register buffer 9 and the SDRAM groups (A) and (B). The refresh detection circuit 4 is coupled between the individual output terminals of the register buffer for the internal control signals Int./S, Int./WE, Int./CAS, and Int./RAS and the mode switches 3 (SWs) in the individual circuit blocks 5 to 8.

In this configuration, the mode switch 3 (SW) operates to switch between a refresh mode (shown by REF=H) and a non-refresh mode (shown by REF=L). When a switch terminal 3a is selected to enter the refresh mode (REF="H"), control is performed to cause a difference in delay time for transferring a refresh command to the SDRAMs in the individual groups. More specifically, the refresh command is directly transferred to the first group SDRAMs-(A) without passing through the delay circuits 2 (D). Meanwhile, a delayed refresh command (Int./S', Int./WE', Int./CAS', and Int./RAS') is transferred to the second group SDRAMs-(B) via the delay circuits 2 (D).

In the figure, in order to set a delay amount D in the delay circuit 2 to substantially correspond to one cycle of the clock CK, the circuit configuration is arranged such that, when the frequency of the base clock CK is 100 MHz, a delay of about 10 ns is obtained. In this case, the configuration can be arranged such that, as shown in the operational timing diagram in FIG. 2, SDRAM-1 to SDRAM-4 in the first group SDRAMs-(A) receive a refresh command at the time T2, and at time T3 after one cycle thereof, SDRAM-5 to SDRAM-8 of the second group SDRAMs-(B) receive the delayed refresh command.

In the configuration arranged as described above, the SDRAMs simultaneously performing refresh operations on the module can be divided to the two groups, i.e., the first and second groups each consisting of the four SDRAMs. Thereby, the peak current can be significantly reduced in comparison to the conventional configuration in which all the eight SDRAMs simultaneously perform the refresh operations.

When a switch terminal 3b for setting to the non-refresh mode (REF="L") is selected by switching operation of the switch 3 (SW), as in the conventional configuration, the internal control signals Int./S, Int./RAS, Int./CAS, and Int./WE are simultaneously transferred to all the SDRAM-1 to SDRAM-8. That is, the command thereof is simultaneously transferred to all the SDRAM-1 to SDRAM-8. In FIG. 2, a delay time tdp (REF) occurring in an output signal of the refresh detection circuit 4 represents the sum of the operational delay in the register buffer, operational delay in the refresh detection circuit, and wiring delay caused in a field up to the switching device.

Figure 3:
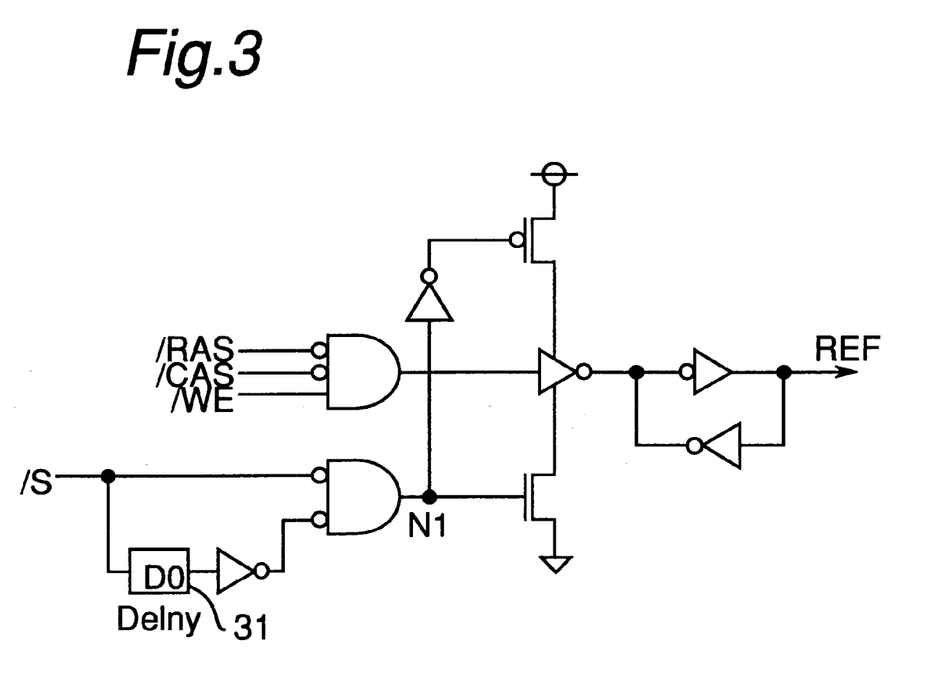
FIG. 3 is a circuit configuration view showing a configuration of a refresh detect circuit according to the first embodiment of the present invention.
Figure 4:
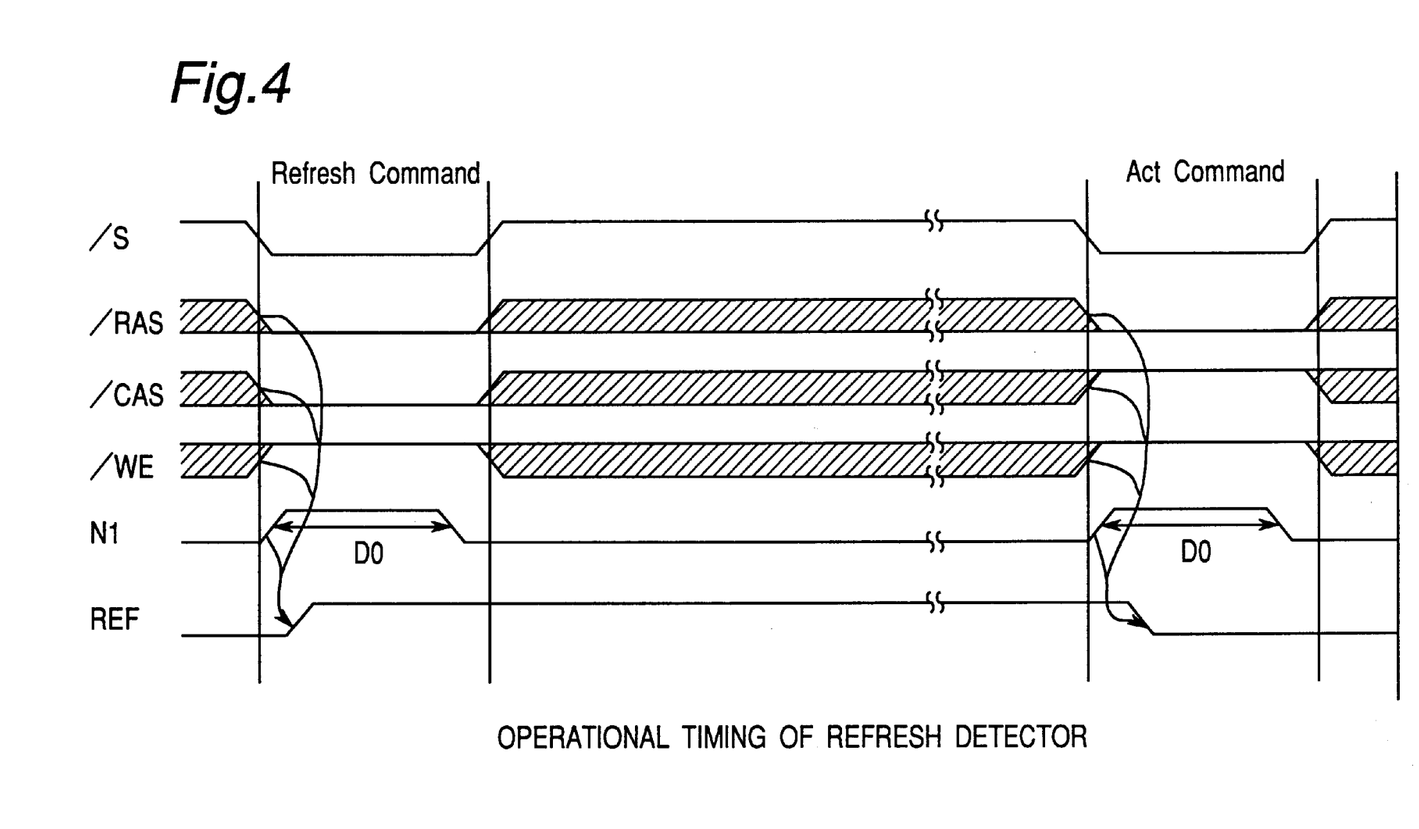
FIG. 4 is a timing diagram representing operations of the refresh detect circuit according to the first embodiment of the present invention.

FIG. 3 shows an example configuration of the refresh detection circuit 4. FIG. 4 is an operational timing diagram in a case where an activation command (Act command) is input after a refresh command is input. In the configuration shown in FIG. 3, an output signal REF of the refresh detection circuit is driven to the H level (i.e., refresh mode) only when a chip-selecting signal IS is in an L level and a refresh command defined by the combination of /RAS=L, /CAS=L, and /WE=H is input.

As shown in FIG. 3, a delay device 31 setting a delay amount DO is used, and on/off operation of a MOSFET is controlled using a signal N1 generated via, for example, an inverter and a NAND gate, and thereby input to a latch circuit is controlled. This configuration prevents that, in FIG. 4, the signals Int./RAS, Int./CAS, and Int./WE change to cause the output signal REF to be in L level before the chip-selecting signal Int./S returns to the H level.

(Second Embodiment)

Hereinbelow, referring to FIGS. 2 to 5, a DRAM module 1 of a second embodiment according to the present invention will be described. The present embodiment has a feature in that in each of the blocks 5 to 8 shown in FIG. 1 explained in the first embodiment, a second delay devices 51 (delay amount Dl) is provided in addition to the delay circuits 2. Other configurations are the same as those of the first embodiment.

As shown in FIG. 2, the aforementioned second delay device 51 is added to achieve a preferable condition of tdp (REF)<tdp. Specifically, the condition is that the delay time tdp (REF) occurring in the output signal REF of the refresh detect circuit 4 is less than a value representing the sum of the delay tdp occurring in the signal Int./S. As described above, the delay time tdp (REF) is the sum of the operational delay in the register buffer, the operational delay in the refresh detect circuit 4, and the wiring delay in the field up to the mode switch 3 (SW).

Meanwhile, the delay tdp represents the sum of the delay caused in the operation within the register buffer and the wiring delay time in the field from the register-buffer output to the SDRAM input. The reason for the above arrangement is that the command signals are transferred to each of the SDRAMs after the mode-setting of the switch device 3 is fixed, and more stable operation can be expected.

Figure 5:
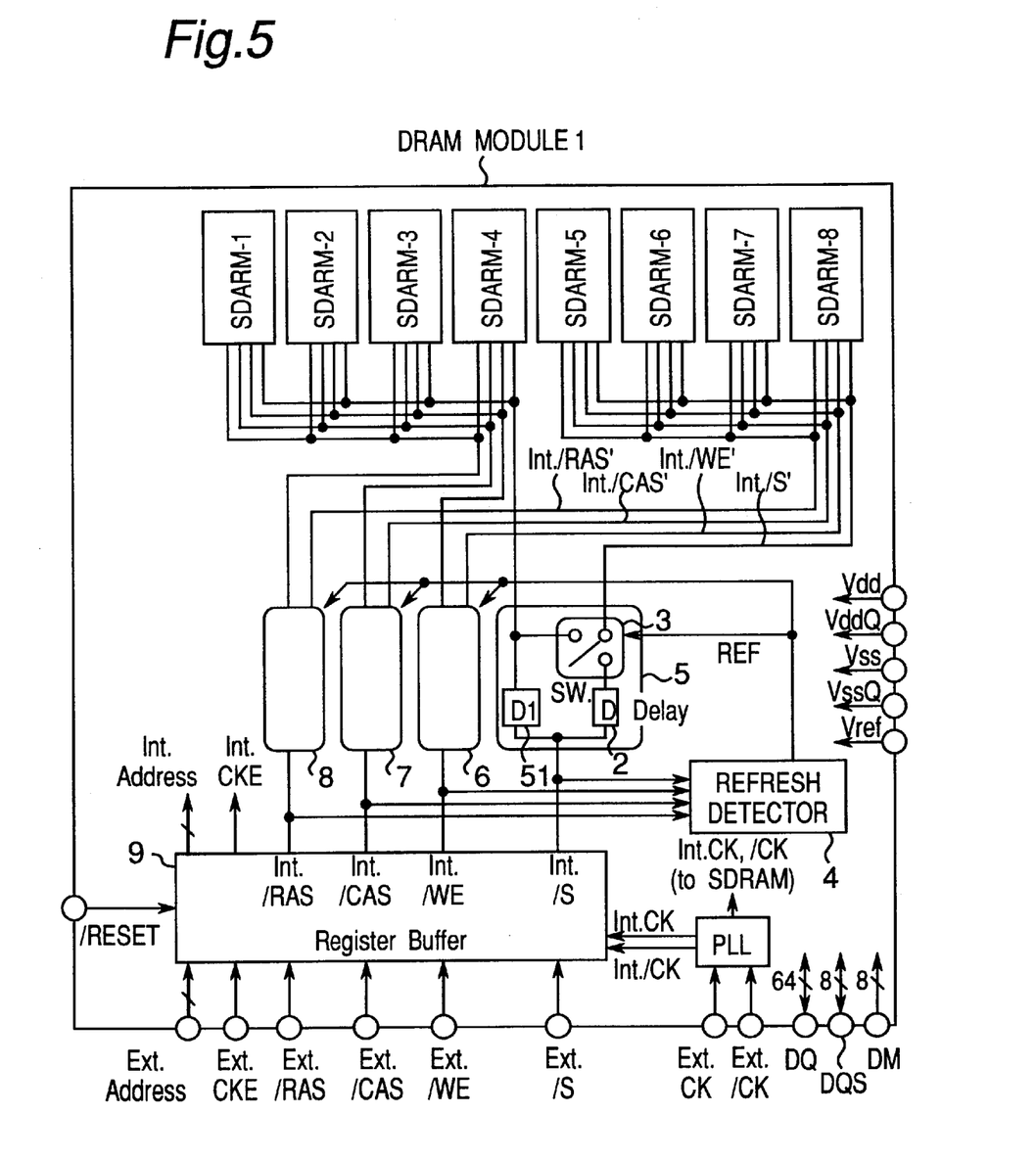
FIG. 5 is a block diagram showing a configuration of a semiconductor memory module according to a second embodiment of the present invention.

For the above reason, the present embodiment further includes the second delay device 51 in each of the circuit blocks 5 to 8 to effectively increase the delay time tdp. However, when the delay amount of the second delay device 51 is excessively large, the time of signal transfer to the SDRAM is excessively increased, causing malfunction. To prevent this, the delay amount (Dl) of the second delay device 51 is set so that tpd is slightly larger than tpd(REF).

(Third Embodiment)

Hereinbelow, a DRAM module of a third embodiment according to the present invention will be described with reference to FIGS. 6 to 7. A configuration example of the present embodiment is shown in FIG. 6 in which the delay circuits 2, switches 3, and refresh detection circuit 4 shown in FIG. 1 explained in the first embodiment are included in a register buffer.

Figure 6:
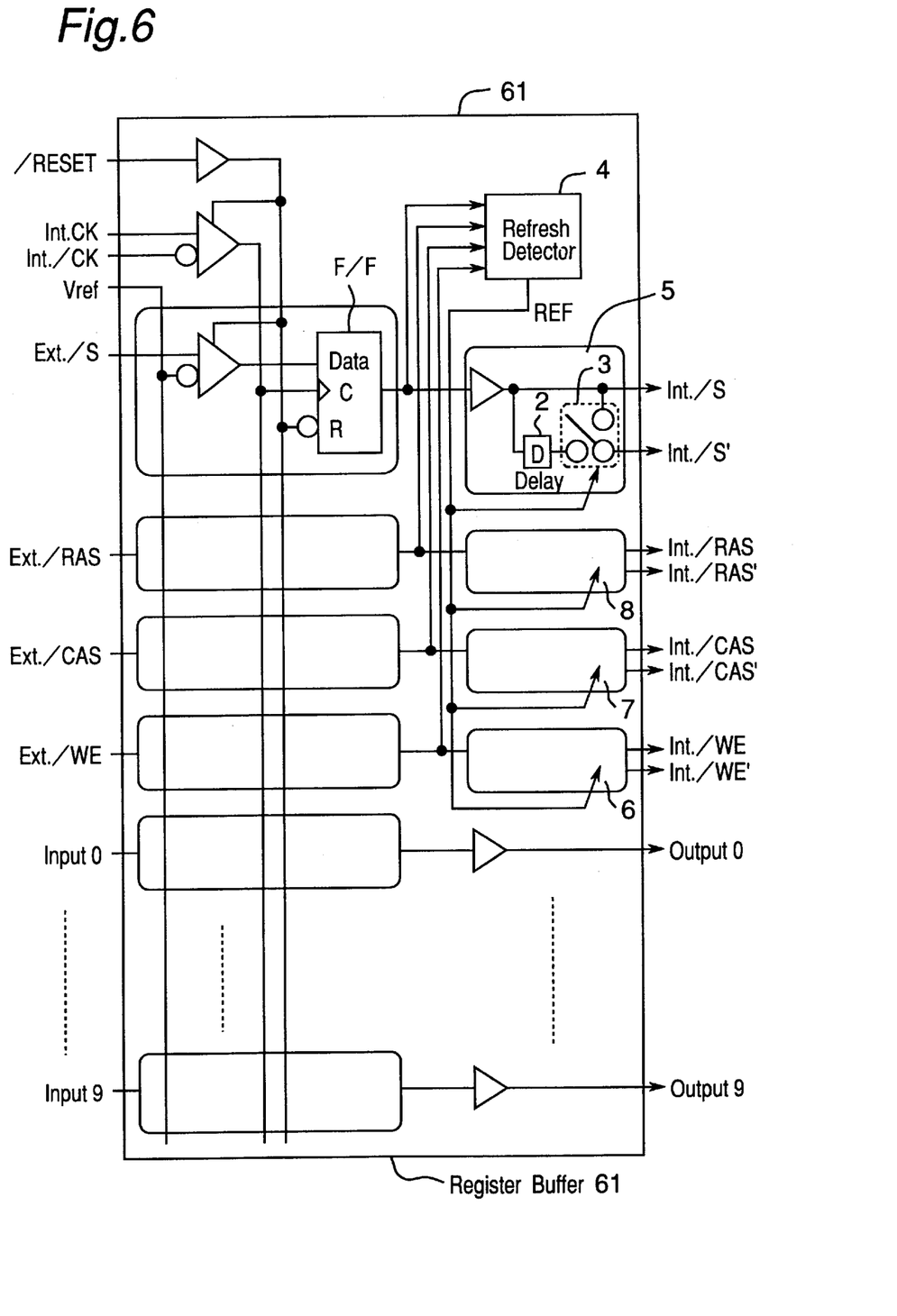
FIG. 6 is a circuit configuration view showing a configuration of a register buffer according to a third embodiment of the present invention.

In specific, a register buffer 61 shown in FIG. 6 has a configuration in a manner such that the register buffer having the conventional configuration shown in FIG. 11 is further provided with the refresh detection circuit 4 and four circuit blocks 5 to 8 each including the delay circuit 2 (D) connected to the switch 3 (SW).

The circuit blocks 5 to 8 are coupled to flip-flop circuits (F/F) corresponding to the external control signals Ext./S, Ext./WE, Ext./CAS, and Ext./RAS, respectively. In this configuration, the register buffer 61 per se outputs the internal control signals Int./S, Int./WE, Int./CAS, and Int./RAS and delayed internal control signals Int./S', Int./WE', Int./CAS', and Int./RAS' individually delayed by the delay circuits 2 thereof.

The refresh detection circuit 4 is coupled between the flip-flop circuits (F/F) and the switch devices 3 (SWs) of the individual circuit blocks 5 to 8. In the configuration, an output signal REF of the refresh detection circuit 4 is input to the individual switch device 3 which is switched based on the level of REF between the refresh mode (REF=H) and the non-refresh mode (REF=L).

Figure 7:
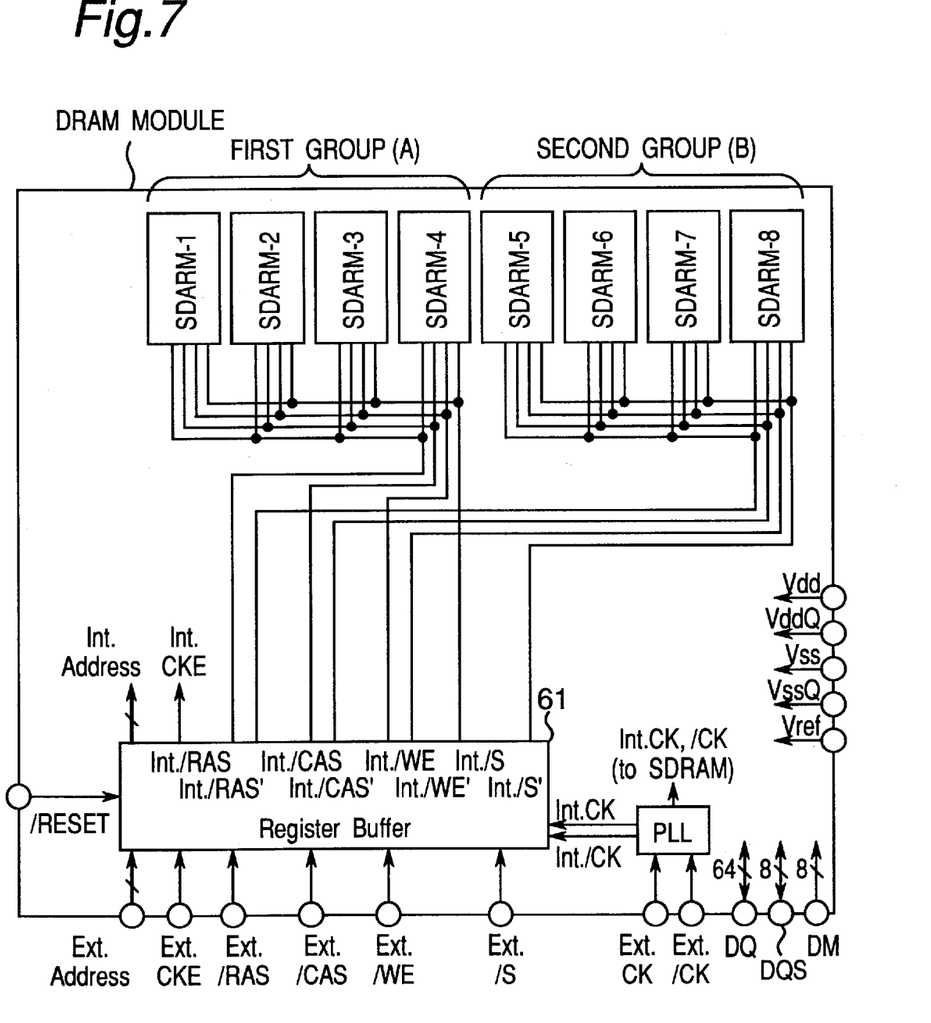
FIG. 7 is a block diagram showing a configuration of a semiconductor memory module according to the third embodiment of the present invention.

FIG. 7 shows a configuration example of a SDRAM DIMM which is formed by mounting the register buffer 61 on the module. In this configuration, when the signal REF is H level for setting the refresh mode, the non-delayed refresh command (i.e., internal control signals Int./S, Int./WE, Int./CAS, and Int./RAS) issued from the register buffer 61 is directly transferred to the first group SDRAMs-(A). Meanwhile, the delayed refresh command (i.e., Int./S', Int./WE', Int./CAS', and Int./RAS') issued from the register buffer 61 is transferred to the second group SDRAMs-(B).

By using the register buffer having the above-described configuration, the peak current in the refresh operation can be minimized without increasing the number of components on the DIMM.

(Fourth Embodiment)

Hereinbelow, referring to FIG. 8, a DRAM module according to a fourth embodiment of the present invention will be described. In each of the circuit blocks 5 to 8 shown in FIG. 1 explained in the first embodiment, two pairs of the delay circuit 2 and switch device 3 are included therein. The SDRAMs that perform refresh operations on the module are separated into three or more groups, and the refresh timings are differentiated by providing time differences in executing the refresh operations of the groups.

Figure 8:
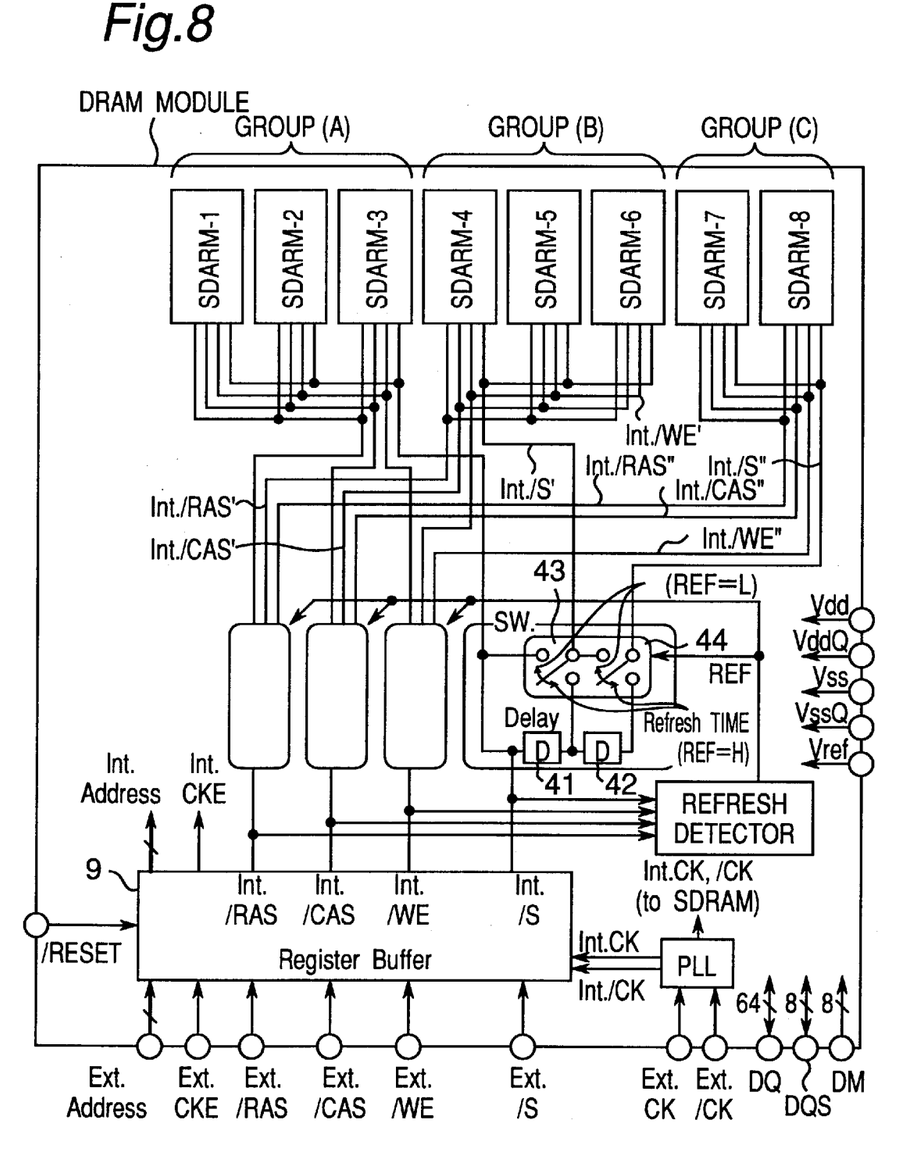
FIG. 8 is a block diagram showing a configuration of a semiconductor memory module according to a fourth embodiment.

FIG. 8 shows a configuration example in which SDRAMs that perform the refresh operations on the module are separated into three groups A, B, and C, and a time difference is provided for the refresh timings of the SDRAMs in each of the groups. Each of the circuit blocks 5 to 8 includes first and second delay devices 41 and 42 and first and second switching devices 43 and 44 in pairs. In this configuration, the delay control is implemented such that, when the refresh mode (REF=H level) is selected, a time difference is produced in the timings at which a refresh command is transferred to the SDRAMs in each of the groups.

The time difference between the group A of SDRAM-1 to SDRAM-3 and the group B of SDRAM-4 to SDRAM-6 is set according to the delay amount of the first delay device 41, and a one-cycle delayed refresh command (Int./S', Int./WE', Int./CAS', and Int./RAS') is transferred to the second group SDRAMs-(B).

In addition, the time difference between the group B of SDRAM-4 to SDRAM-6 and the group C of SDRAM-7 and SDRAM-8 is set according to the delay amount of the second delay device 42, and a two-cycle delayed refresh command (Int./S", Int./WE", Int./CAS", and Int./RAS") is transferred to the third group SDRAMs-(C).

According to the above-described configuration, as shown in the figure, the eight SDRAMs that perform refresh operations on the module can be distributed into, for example, three groups individually consisting of three SDRAMs, three SDRAMs, and two SDRAMs. As such, compared to the conventional example in which all the eight SDRAMs simultaneously perform refresh operations, the configuration of the present embodiment enables the peak current to be significantly reduced.

When the non-refresh mode (REF=L level) has been selected, as in the conventional configuration, non-delayed internal control signals Int./S, Int./RAS, Int./CAS, and Int./WE are simultaneously transferred to all the eight SDRAMs. Accordingly, all the eight SDRAMs simultaneously execute the transferred commands.

(Fifth Embodiment)

Figure 9:
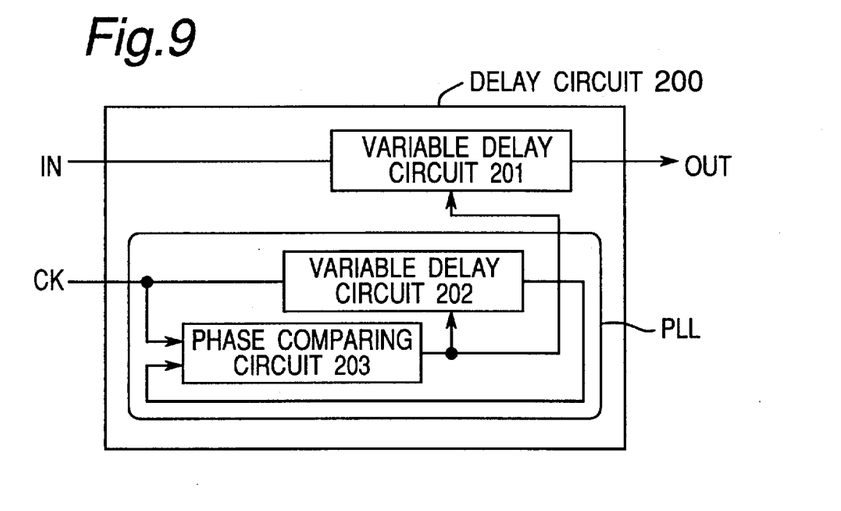
FIG. 9 is a block diagram showing a configuration of a variable delay circuit according to a fifth embodiment of the present invention.

Referring to FIG. 9, a fifth embodiment of the present invention will be described. In the fifth embodiment, variable delay circuits are used as the delay circuits 2 (or, 41 and 42) which are individually set to have the delay amount D in the above-described embodiments 1 to 4.

As shown in FIG. 9, a delay circuit 200 includes a first variable delay circuit 201 provided on a command signal line and a second variable delay circuit 202 provided on a base clock CK line on the DIMM. The first variable delay circuit 201 and the second variable delay circuit 202 have identical configurations. In addition, a PLL circuit is configured of the second variable delay circuit 202 and a phase-comparing circuit 203.

With the PLL circuit configured as described above, the delay amount D of the delay circuit 200 is furnished with a self-adjusting function that self-adjusts the delay amount to be always kept as that corresponding to one cycle of the frequency at that time according to a frequency variation of the base clock CK.

In specific, the phase-comparing circuit 203 compares and checks the phase difference between the base clock CK and the delay amount output of the second variable delay circuit 202. According to the comparison result, the second variable delay circuit 202 is controlled. More specifically, the delay amount of the second variable delay circuit 202 is adjusted so that the phases of the base clock CK and the output of the second variable delay circuit 202 are the same (that is, the adjustment makes the phase difference to be zero therebetween). Then, the adjusted delay amount just corresponds to one cycle of the frequency of the base clock CK.

When every time the frequency of the base clock CK varies, the second variable delay circuit 202 is controlled to produce the delay amount corresponding to just one cycle of the frequency at that time. On the other hand, since the first variable delay circuit 201 provided on a command signal line on the DIMM is also configured identical to the second variable delay circuit 202, the two circuits are controlled by the same output signal of the phase-comparing circuit 203. Consequently, the delay amount of the first variable delay circuit 201 is also controlled to always correspond to one cycle of the frequency at that time.

By employing the delay circuit 200 configured as described above as the delay circuit 2 (or 41, 42) in each configuration of the embodiments 1 to 4, at the time T3 in FIG. 2 for example, the configuration enables the prevention of reduction in a timing margin when SDRAM-5 to SDRAM-8 of the second group receive the refresh command.

Suppose a case occurs in which the delay amount D greatly differs from the cycle time of the base clock CK. This case represents a phenomenon in which the data of the refresh-command signals Int./S', Int./RAS', Int./CAS', and Int./WE' to be received by SDRAM-5 to SDRAM-8 are not valid, and a malfunction is thereby caused. This phenomenon can be prevented by employing the delay circuit having the self-adjusting function according to the present embodiment.

As described above, the present invention enables the provision of a semiconductor memory module and the register buffer used in the semiconductor memory module in which refresh-command execution timings are differentiated and distributed. This inhibits occurrence of a phenomenon in which a plurality of DRAMs simultaneously enter refresh modes to cause a great peak current to flow to cause a Vdd/GND noise. Thus, the present invention thereby enables a stable operation to be implemented.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor memory module which is provided with a plurality of dynamic semiconductor memories, and which generates internal control signals as a command to be applied to the plurality of individual dynamic semiconductor memories according to external control signals externally input to thereby execute the command, the semiconductor memory module comprising:

mode determining means for determining whether or not the command is a refresh command in a refresh mode according to the internal control signals; and delay means for establishing a delay in applying the internal control signals to a partial number of dynamic semiconductor memories preliminarily selected among the plurality of dynamic semiconductor memories, whereby the refresh command is transferred to the plurality of dynamic semiconductor memories with a time difference according to the delay in the refresh mode.

2. The semiconductor memory module according to claim 1, further comprising switching means for switching as to whether or not the delayed internal control signals are selected according to a determination result by said mode determining means, and when the mode determining means detects the refresh mode, said switching means selects the delayed internal control signals as the refresh command which is transferred to the partial number of dynamic semiconductor memories with the time delay.

3. The semiconductor memory module according to claim 2, further comprising a delay circuit for delaying the internal control signals for said plurality of individual dynamic semiconductor memories by a predetermined delay amount, wherein:

said delay amount is set such that a delay time occurring in an output signal of said mode determining means is less than a value representing the sum of wiring delay times occurring in a field from generation of the internal control signals to the input to said plurality of individual dynamic semiconductor memories; and the command of said internal control signals is transferred to each of said dynamic semiconductor memories after the mode selection state according to said switching means is fixed.

4. The semiconductor memory module according to claim 2, wherein said dynamic semiconductor memory is a synchronous memory and said delay means has a variable-delay circuit of which a delay amount is variable, and the time difference provided for differentiating the timings of the refresh operations is self-adjusted to be equal to one cycle of the frequency of the base clock.

5. The semiconductor memory module according to claim 4, wherein said variable-delay circuit comprises a first variable delay circuit, a second variable delay circuit, and a phase-comparing circuit, and wherein said first variable delay circuit and said second variable delay circuit have substantially the same configuration, and said second variable delay circuit and said phase-comparing circuit constitute a PLL circuit.

6. The semiconductor memory module according to claim 5, wherein said phase-comparing circuit compares said base clock and an output of said second variable delay circuit to check a phase difference thereof, to thereby adjust said second variable delay circuit according to the result of the comparison in such a manner that a delay amount of said second variable delay circuit is adjusted so that the phases of said base clock and the output of said second variable delay circuit agree with each other, whereby in response to a variation in the frequency of the base clock, a variable delay amount corresponding to one cycle of the current frequency of the base clock is always obtained.

7. The semiconductor memory module according to claim 1, wherein said plurality of dynamic semiconductor memories are divided into a plurality of groups, and a predetermined time difference is provided to timings of performing refresh operations of the groups.

8. The semiconductor memory module according to claim 7, wherein said dynamic semiconductor memory is a synchronous memory, and wherein the time difference in the timings of the refresh operations of said plurality of groups corresponds to one cycle of a frequency of a base clock used for controlling said synchronous memory.

9. The semiconductor memory module according to claim 7, comprising two or more pairs of said delaying means and said switching means, wherein:

said plurality of dynamic semiconductor memories to be refreshed are divided into three or more groups; and timings of performing the refresh operations of said groups are differentiated from each other by providing a time difference therebetween.

10. A register buffer device used in a semiconductor memory module having a plurality of dynamic semiconductor memories mounted thereon, the register buffer device comprising:

means for generating internal control signals for executing a command for the plurality of individual dynamic semiconductor memories according to external control signals externally input to the register buffer device;

mode determining means for determining whether or not the command is a refresh command in a refresh mode according to the external control signals; and delay means for establishing a delay in the internal control signals to be supplied to a partial number of dynamic semiconductor memories preliminarily selected among the plurality of dynamic semiconductor memories, whereby the refresh command is transferred to the plurality of dynamic semiconductor memories with a time difference according to the delay in the refresh mode.

11. The register buffer device according to claim 10, further comprising switching means for switching as to whether or not the delayed internal control signals are selected according to a determination result by said mode determining means, and when the mode determining means detects the refresh mode, said switching means selects the delayed internal control signals as the refresh command which is transferred to the partial number of dynamic semiconductor memories with the time delay.

12. A register buffer device used in a semiconductor memory module having a plurality of dynamic semiconductor memories mounted thereon, the register buffer device comprising control means for performing control operations of:

generating internal control signals for executing a command for the plurality of individual dynamic semiconductor memories according to external control signals externally input to the register buffer device;

determining whether or not the command is a refresh command in a refresh mode according to the external control signals; and establishing a delay in the internal control signals to be supplied to a partial number of dynamic semiconductor memories preliminarily selected among the plurality of dynamic semiconductor memories, whereby the refresh command is transferred to the plurality of dynamic semiconductor memories with a time difference according to the delay in the refresh mode.

13. The register buffer device according to claim 12, wherein said control means further performs a switch-control as to whether or not the delayed internal control signals are selected according to a determination result by the mode determination, and when the refresh mode is detected in the mode determination, the switch-control selects the delayed internal control signals as the refresh command which is transferred to the partial number of dynamic semiconductor memories with the time delay.

* * * * *

UNITED STATES PATENT AND TRADEMARK OFFICE
CERTIFICATE OF CORRECTION

PATENT NO.    : 6,650,588 B2
DATED         : November 18, 2003
INVENTOR(S)   : Tadato Yamagata It is certified that error appears in the above-identified patent and that said Letters Patent is hereby corrected as shown below:

<u>Title page,</u>
Item [73], Assignee, change "Mitsubishi Denki Kabushiki Kaisha, Tokyo (JP)" to
-- Renesas Technology Corp, Tokyo (JP) --

Signed and Sealed this

Thirtieth Day of March, 2004

JON W. DUDAS
*Acting Director of the United States Patent and Trademark Office*